(12) United States Patent
Joshi et al.

(10) Patent No.: US 7,551,508 B2
(45) Date of Patent: Jun. 23, 2009

(54) ENERGY EFFICIENT STORAGE DEVICE USING PER-ELEMENT SELECTABLE POWER SUPPLY VOLTAGES

(75) Inventors: Rajiv V. Joshi, Yorktown Heights, NY (US); Jente B Kuang, Austin, TX (US); Rouwaida N. Kanj, Round Rock, TX (US); Sani R. Nassif, Austin, TX (US); Hung Cai Ngo, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 12 days.

(21) Appl. No.: 11/941,168

(22) Filed: Nov. 16, 2007

(65) Prior Publication Data

US 2009/0129193 A1    May 21, 2009

(51) Int. Cl.
    *G11C 5/14* (2006.01)
(52) U.S. Cl. .................. 365/226; 365/227; 365/228; 365/229; 365/63
(58) Field of Classification Search ................. 365/226, 365/227, 228, 229, 63
See application file for complete search history.

(56) References Cited

U.S. PATENT DOCUMENTS

| | | | | |
|---|---|---|---|---|
| 5,297,097 A * | 3/1994 | Etoh et al. | ................. | 365/226 |
| 5,687,382 A | 11/1997 | Kojima et al. | | |
| 6,031,781 A * | 2/2000 | Tsuji et al. | ............. | 365/189.08 |
| 6,107,700 A * | 8/2000 | Ishikawa et al. | ............ | 307/116 |
| 6,208,171 B1 * | 3/2001 | Kumagai et al. | ............ | 326/121 |
| 6,233,181 B1 * | 5/2001 | Hidaka | ........................ | 365/200 |
| 6,291,869 B1 * | 9/2001 | Ooishi | ........................ | 257/500 |
| 6,292,413 B1 * | 9/2001 | Kato et al. | ................... | 365/200 |
| 6,459,301 B2 * | 10/2002 | Hidaka | ........................ | 326/83 |
| 6,515,930 B2 * | 2/2003 | Jacquet et al. | ............. | 365/222 |
| 6,795,328 B2 * | 9/2004 | Kato et al. | ..................... | 365/63 |
| 7,055,007 B2 * | 5/2006 | Flautner et al. | ............. | 711/156 |
| 7,085,190 B2 * | 8/2006 | Worley et al. | .......... | 365/230.06 |
| 7,327,630 B2 * | 2/2008 | Park | .......................... | 365/226 |
| 2005/0253462 A1 * | 11/2005 | Falkowski et al. | ............ | 307/43 |
| 2007/0141731 A1 | 6/2007 | Hemink et al. | | |
| 2007/0200593 A1 * | 8/2007 | Agarwal et al. | ............. | 326/38 |
| 2008/0162954 A1 * | 7/2008 | Lassa et al. | ................. | 713/300 |
| 2008/0229121 A1 * | 9/2008 | Lassa et al. | ................. | 713/300 |

* cited by examiner

*Primary Examiner*—Viet Q Nguyen
(74) *Attorney, Agent, or Firm*—Mitch Harris, Atty at Law, LLC; Andrew M. Harris; Libby Z. Handelsman

(57) ABSTRACT

An energy efficient storage device using per-element selectable power supply voltages provides energy conservation in storage devices while maintaining a particular performance level. The storage device is partitioned into multiple elements, which may be sub-arrays, rows, columns or individual storage cells. Each element has a corresponding virtual power supply rail that is provided with a selectable power supply voltage. The power supply voltage provided to the virtual power supply rail for an element is set to the minimum power supply voltage unless a higher power supply voltage is required for the element to meet performance requirements. A control cell may be provided within each element that provides a control signal that selects the power supply voltage supplied to the corresponding virtual power supply rail. The state of the cell may be set via a fuse or mask, or values may be loaded into the control cells at initialization of the storage device.

14 Claims, 8 Drawing Sheets

ENERGY EFFICIENT STORAGE DEVICE USING PER-ELEMENT SELECTABLE POWER SUPPLY VOLTAGES

CROSS-REFERENCE TO RELATED APPLICATION

This application is related to co-pending U.S. patent application Ser. No. 11/941,161, filed concurrently herewith and entitled "METHOD AND SYSTEM FOR DETERMINING ELEMENT VOLTAGE SELECTION CONTROL VALUES FOR A STORAGE DEVICE", by the same inventors and assigned to the same Assignee. The above-referenced U.S. patent application is incorporated herein by reference.

BACKGROUND OF THE INVENTION

1. Technical Field

The present invention relates generally to storage devices, and more particularly to a storage device having per-element selectable power supply voltages.

2. Description of the Related Art

Storage array energy usage vs. performance is a critical trade-off in present-day processing systems. System memory, as well as internal and external processor caches and internal registers, consume a large portion of total system power, particularly in network server systems in which processors and memory modules form the majority of components in the typical server rack. In order to maximize performance, or to provide a specified maximum performance level, the frequency at which the storage arrays are operated is typically raised to a level at which energy consumption limits or diminishing returns are encountered, performance limitations of the technology are encountered, and/or power dissipation limits are reached.

In particular, storage arrays such as static random access memories (SRAMs) have a performance profile in which stability/writability and access time all improve with voltage over the power supply voltage region over which the SRAMs are typically operated. However, as the power supply voltage provided to such storage devices is increased, the power consumption increases dramatically, due to the proportionality of logic transition energy to the square of the voltage. Therefore, while it is desirable to operate such devices at the high end of their practical voltage range, it is also necessary to curtail power requirements for a number of reasons, including power usage, heat generation and reliability reduction.

Below the limits of the technology itself, the primary control of the maximum frequency performance of storage arrays is their operating voltage, which is also the primary factor determining energy usage. Therefore, a tradeoff between energy consumption and performance is typically present. However, the operating voltage for a given performance level also sets a production yield criteria on the storage array devices themselves, as each device typically has a minimum operating voltage at which each element in the storage array will perform reliably and therefore across a production run, a particular specified minimum operating voltage dictates a yield of devices that will operate at that voltage across other ranges of environmental parameters such as temperature.

Within a storage array device or other device incorporating a storage array, the minimum operating voltage for various individual element partition levels, e.g., sub-array, column, row or individual cell varies due to variations across the die and the particular design architecture which may place higher performance burdens on particular positions of the elements. However, since the supply voltage is typically distributed as evenly as possible across the array, the minimum reliable operating voltage for the worst-case storage cell typically dictates the minimum operating voltage for the entire storage array. Therefore, the minimum operating voltage for a particular storage array design therefore dictates the minimum nominal energy consumption level for a particular frequency of operation/access to the storage subsystems or processing devices incorporating the storage device design.

It is therefore desirable to provide a storage array device having a reduced energy consumption while meeting yield and performance requirements at a specified operating frequency and environment.

SUMMARY OF THE INVENTION

The objective of providing a storage device having a reduced energy consumption while meeting yield and performance requirements is met in a storage device and method of operation of the storage device. The method is a method of operation of the storage circuit. Another method, system and computer program product provide for initialization of values in the storage array that control the power supply voltage provided to individual elements of the storage device, so that power consumption of the storage device is reduced while ensuring that the storage device meets a minimum specified performance level.

The storage device is partitioned into a plurality of storage elements each having a corresponding virtual power supply rail that is provided with multiple selectable power supply voltages. The storage device elements may be sub-arrays, rows, columns or other partitions of an array storage device. The power supply voltage applied to each corresponding virtual power supply rail is selected as a lower one of the multiple operational power supply voltages, unless a higher power supply voltage is needed for the corresponding element to meet performance requirements.

The storage device elements may each include a control cell programmed with a state that provides a power supply voltage selection control signal for selecting the voltage applied to a corresponding storage device element, which may be provided via a fuse or mask programmable at test time, or which may be loaded into the storage device at each initialization from a set of values determined during functional testing of the storage device.

The foregoing and other objectives, features, and advantages of the invention will be apparent from the following, more particular, description of the preferred embodiment of the invention, as illustrated in the accompanying drawings.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein like reference numerals indicate like components, and:

DESCRIPTION OF ILLUSTRATIVE EMBODIMENT

The present invention concerns storage devices such as static random access memories (SRAMs), in which for a particular design, the power supply voltage supplied to the storage elements that make up the storage device is selected from among two or more different non-zero power supply voltages. By providing a selectable power supply voltage for individual elements within the storage device, the yield of a storage device production run can be increased, by increasing the voltage supplied to marginal elements for which full performance is not obtained at the lower power supply voltage. The marginal elements are generally detected during manufacturing test of the storage device. The above-incorporated U.S. patent application "METHOD AND SYSTEM FOR DETERMINING ELEMENT VOLTAGE SELECTION CONTROL VALUES FOR A STORAGE ARRAY" discloses and claims methods and systems for obtaining initial voltage selection values for controlling the storage device of the present invention. However, selection of a higher voltage level for a device element may be made in response to a field-detected failure, a change in environmental characteristics such as temperature, and/or location of the element within the device. The techniques of the present invention may also be used in conjunction with device repair using redundant elements, or redundant sets of cells across multiple elements, so that devices that could otherwise not be repaired to be operable at a desired operating voltage can be used with a higher operating voltage applied to elements that would otherwise fail to meet performance margins.

Thus, the present invention provides a mechanism to operate marginal devices at a higher operating voltage without requiring the increase in power consumption/dissipation that would otherwise occur if the entire device were operated at the higher operating voltage. The element partition level at which voltage control is provided may be per-row, per-column, or per-subarray. Per storage cell power supply control is possible, but would require a voltage selector for each cell. Other combinations of storage cells are also possible, such as grouping selected storage cells according to their nominal design performance, but in general, the organization of storage devices such as SRAMs into arrays yields an organized structure for the voltage selection circuits included in the storage devices according to the present invention.

Figure 1:
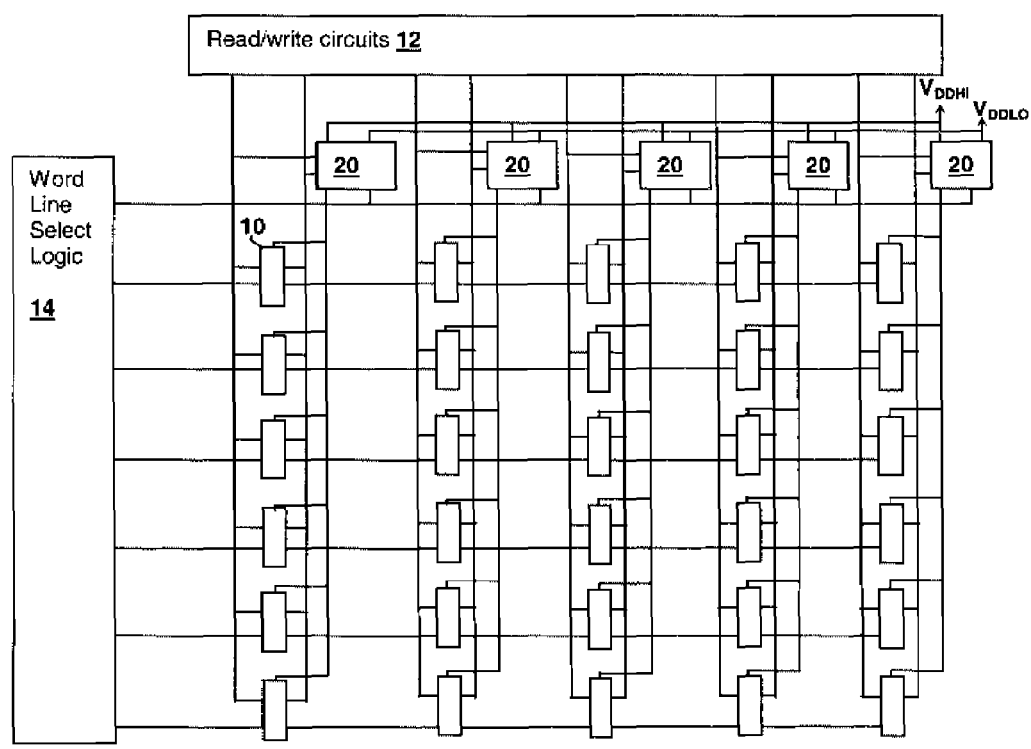
FIG. 1 is a block diagram of a storage array circuit in accordance with an embodiment of the invention.

Referring now to FIG. 1, a storage device in accordance with an embodiment of the present invention is shown in the form of an SRAM storage array circuit. A sub-array of storage cells 10, forming rows and columns are connected to read/write access circuitry. The read/write access circuitry include a word line select logic 14, which activates cells 10 in a row according to word line control signals, and read/write circuits 12 that are connected to bitlines of the storage array composed of storage cells 10. Read/write circuits 12 pre-charge the bitlines connected to storage cells 10 in preparation for a storage cell 10 read access and captures the values of the bitlines after a read access. Read/write circuits 12 also set the values of the bitlines according to input values during storage cell 10 write accesses.

In the depicted embodiment, the power supply voltage for each column of storage cells 10 is selectable by a set of voltage selection circuits 20 that provide power from one of two or more power supply voltage distribution nets, illustrated as voltages $V_{DDHI}$ and $V_{DDLO}$. In the illustrated embodiment, voltage selection circuits 20 are coupled to the bitlines of their corresponding column and include functional storage cell capability, so that digital control values that are written to voltage selection circuits 20 control selection of the power supply voltage by writing the digital control values to the additional "row" comprising voltage selection circuits 20. An additional wordline is provided from wordline select logic 14 for writing the digital control values to voltage selection circuits 20.

Figure 2A:
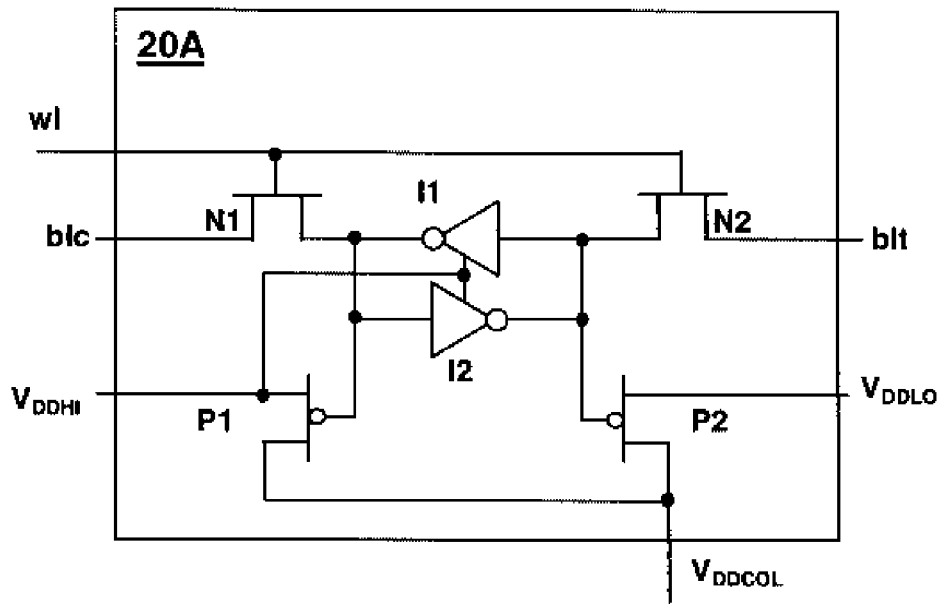
FIGS. 2A-2B and FIGS. 3A-3B are schematic diagrams showing circuits for implementing voltage selection circuit 20 of FIG. 1 in accordance with various embodiments of the invention.

Referring now to FIG. 2A, a voltage selection circuit 20A that may be used to implement voltage selection circuits 20 of FIG. 1 is shown. Inverters I1 and I2 are cross-coupled to provide an SRAM storage latch and pass transistors N1 and N2 couple the storage latch to bitlines blc and blt. The circuit comprising transistors N1-N2 and inverters I1-I2 thus form an SRAM storage cell. Power supply control transistors P1 and P2 are provided within voltage selection circuit 20A to select between a higher power supply input voltage $V_{DDHI}$ and a lower power supply voltage $V_{DDLO}$. The value written to the SRAM storage latch formed by inverters I1 and I2 directly controls which of power supply voltages $V_{DDHI}$ or $V_{DDLO}$ is applied to output $V_{DDCOL}$, which provides a "virtual power supply rail" at the selected power supply voltage to the storage cells in the corresponding column. Inverters I1 and I2, along with any other logic added to voltage selection circuit 20 according to other embodiments of the invention, are operated from power supply voltage $V_{DDHI}$ to ensure proper operation under all operating conditions and process variations. Additional voltage selection options may be provided by increasing the number of storage latches and power supply control transistors. For example, by using two storage latches and decode logic controlling four power supply control transistors, the circuit can select between for operating voltages for the corresponding column.

Figure 2B:
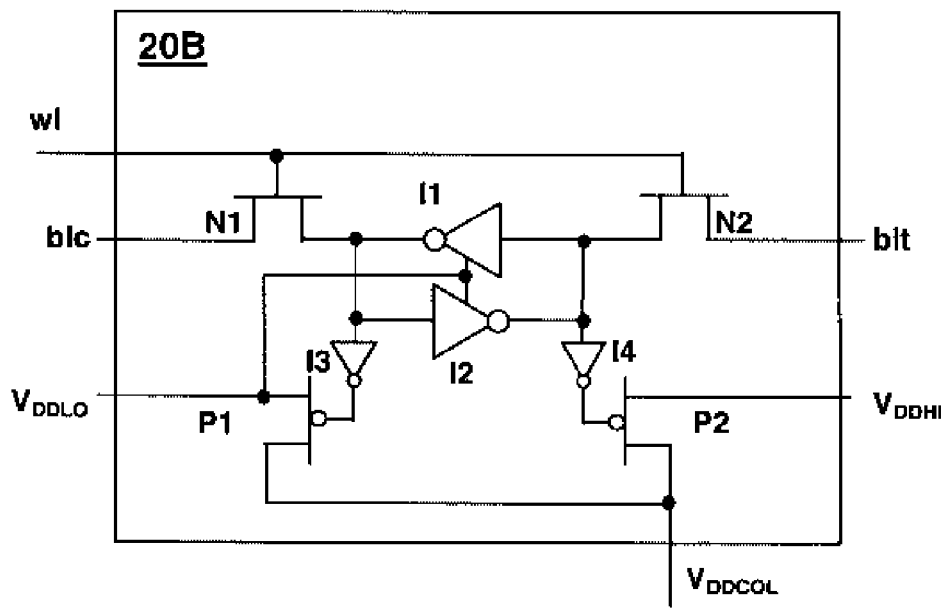

Referring now to FIG. 2B, another voltage selection circuit 20B that may alternatively be used to implement voltage selection circuit 20 of FIG. 1 is shown. Voltage selection circuit 20B is similar to voltage selection circuit 20A of FIG. 2A and therefore only differences between them will be described below. The size of the cell used to control power supply control transistors P1 and P2 must generally be larger than an ordinary storage cell, due to the connection of the gates of power supply control transistors P1 and P2 to the internal nodes of the storage cell. Since power supply control transistors P1 and P2 must be large enough to avoid introducing a significant voltage drop at the virtual power supply rail output $V_{DDCOL}$, the gate capacitance of transistors P1 and P2 will generally also be significant, raising the critical charge $Q_{crit}$ of the storage cell and affecting the writability of the storage cell. By including inverters I3 and I4, $Q_{crit}$ is reduced to a value approaching that of an ordinary storage cell, thereby making voltage selection circuit 20B more compatible with the timing and current scaling of the rest of the storage cells in the array of FIG. 1.

Figure 3A:
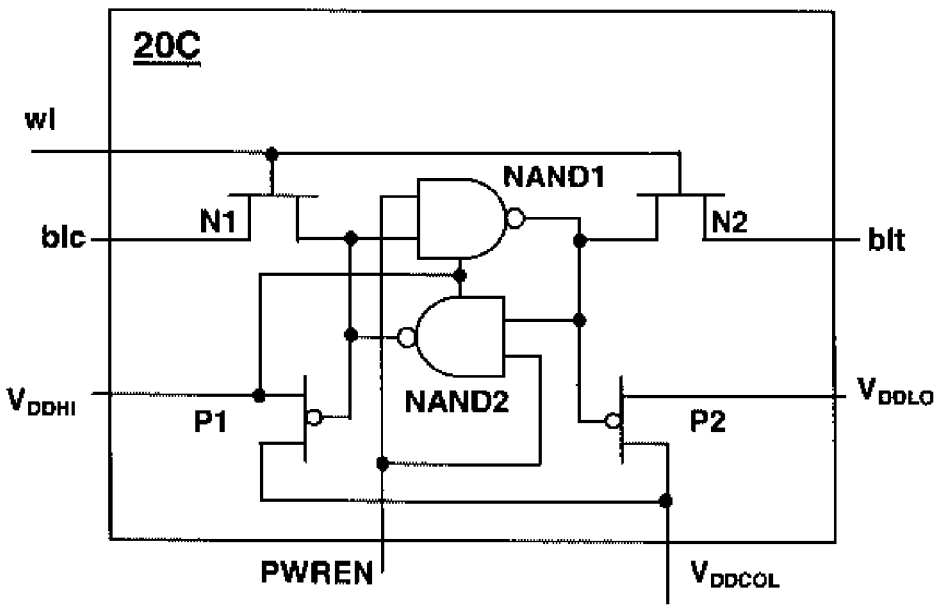

Referring now to FIG. 3A, yet another voltage selection circuit 20C that may alternatively be used to implement voltage selection circuit 20 of FIG. 1 is shown. Voltage selection circuit 20B is similar to voltage selection circuit 20A of FIG. 2A and therefore only differences between them will be described below. Instead of inverters I1 and I2 of FIG. 2A, voltage selection circuit 20C uses two logical-NAND gates NAND1 and NAND2 to implement the storage latch, and a power enable signal PWREN is provided to one input of each of logical-NAND gates NAND1 and NAND2, so that the power supply voltage to the corresponding storage device element supplied by output $V_{DDCOL}$ is disabled when power enable signal PWREN is de-asserted (PWREN=logic "0").

Figure 3B:
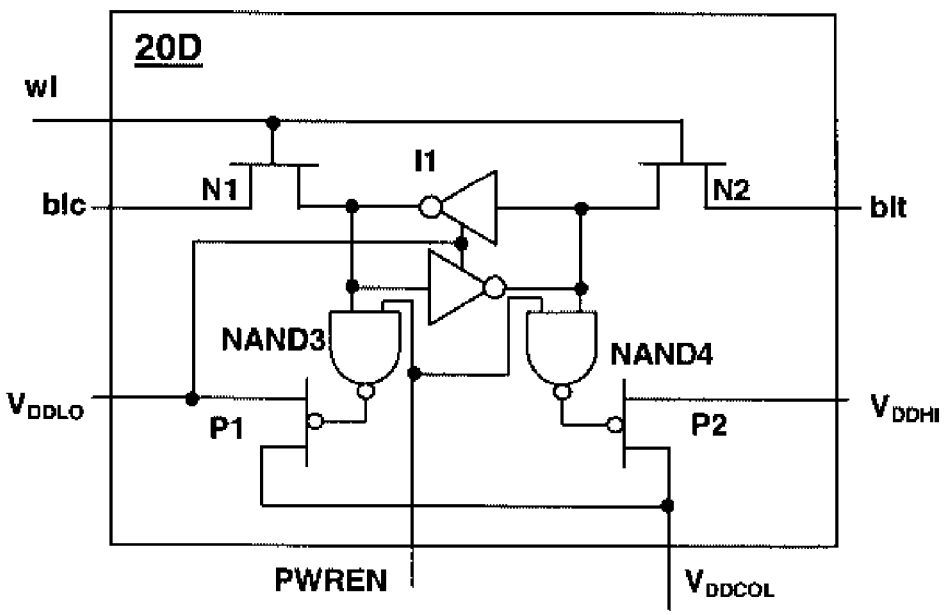

Referring now to FIG. 3B, still another voltage selection circuit 20D that may alternatively be used to implement voltage selection circuit 20 of FIG. 1 is shown. Voltage selection circuit 20D is similar to voltage selection circuit 20A of FIG. 2A and therefore only differences between them will be described below. Voltage selection circuit 20D includes logical-NAND gates NAND3 and NAND4 coupled between the internal nodes of the SRAM storage cell and power enable signal PWREN is provided to one input of each of logical-NAND gates NAND3 and NAND4, so that the power supply voltage to the corresponding storage device element supplied by output $V_{DDCOL}$ is disabled when power enable signal PWREN is de-asserted (PWREN=logic "0"). Logical-NAND gates NAND3 and NAND4 also provide for reduction of $Q_{crit}$ as provided by inverters I3 and I4 in voltage selection circuit 20B of FIG. 2B.

Figure 4:
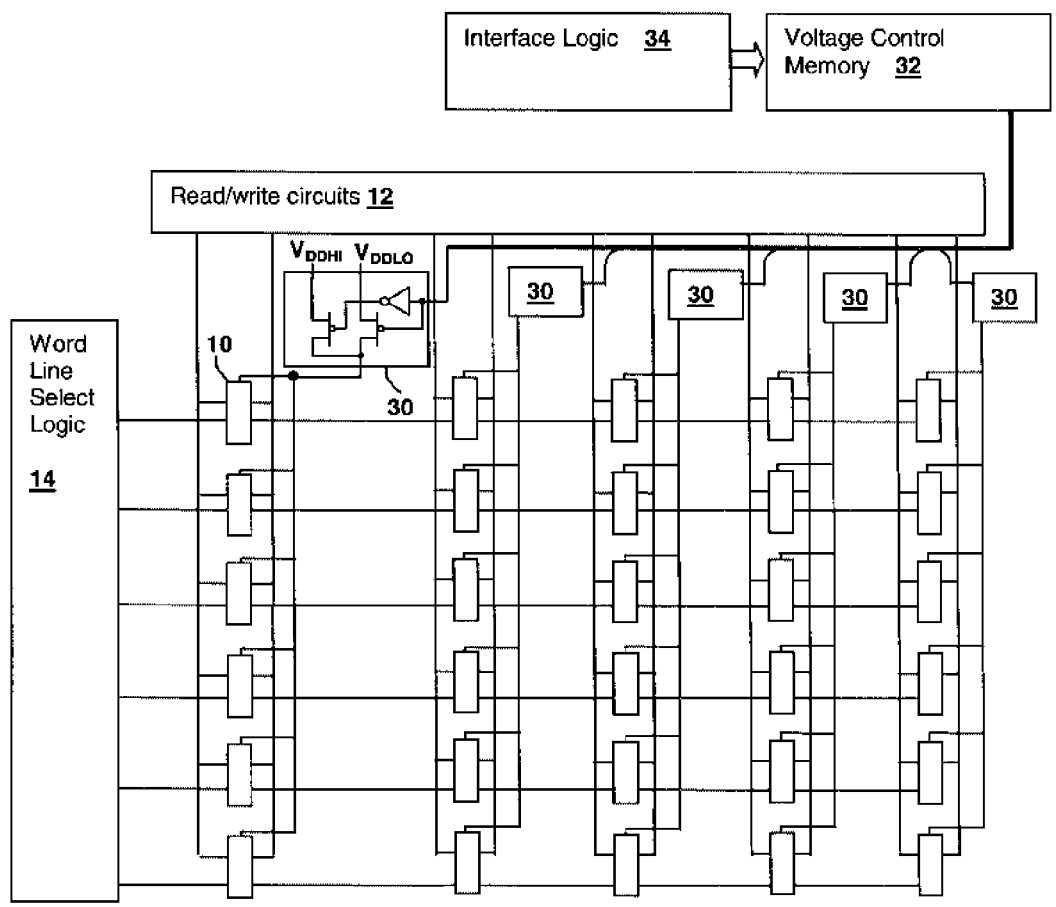
FIG. 4 is a block diagram of a storage array circuit in accordance with another embodiment of the invention.

Referring now to FIG. 4, a storage device in accordance with another embodiment of the present invention is shown in the form of an SRAM storage array circuit. The storage array circuit of FIG. 4 is similar to storage array circuit of FIG. 1 and therefore only differences between them will be described below. In the circuit of FIG. 4, voltage selection circuits 30 do not include a storage latch acting as a cell in the corresponding column. Instead, the digital control values that select between power supply voltages $V_{DDHI}$ or $V_{DDLO}$ is provided from a separate voltage control memory 32, which may be a fuse or mask selected memory or may be a static or dynamic memory accessible via an interface logic 34 that can be bus coupled to a processor or other device, or may be another interface a scan latch interface accessible via a service processor or primary processor to initialize the digital control values. Portions of the write logic associated with the storage cell access may be used to provide all or a portion of interface logic 34. Similarly, the bitlines of the storage array may be used to set values in voltage control memory 32, with separate write logic provided for writing the values. When the bitlines and wordline logic are shared between the storage array and voltage control memory 32, a storage array such as that illustrated in FIG. 1 is the result.

Figure 5:
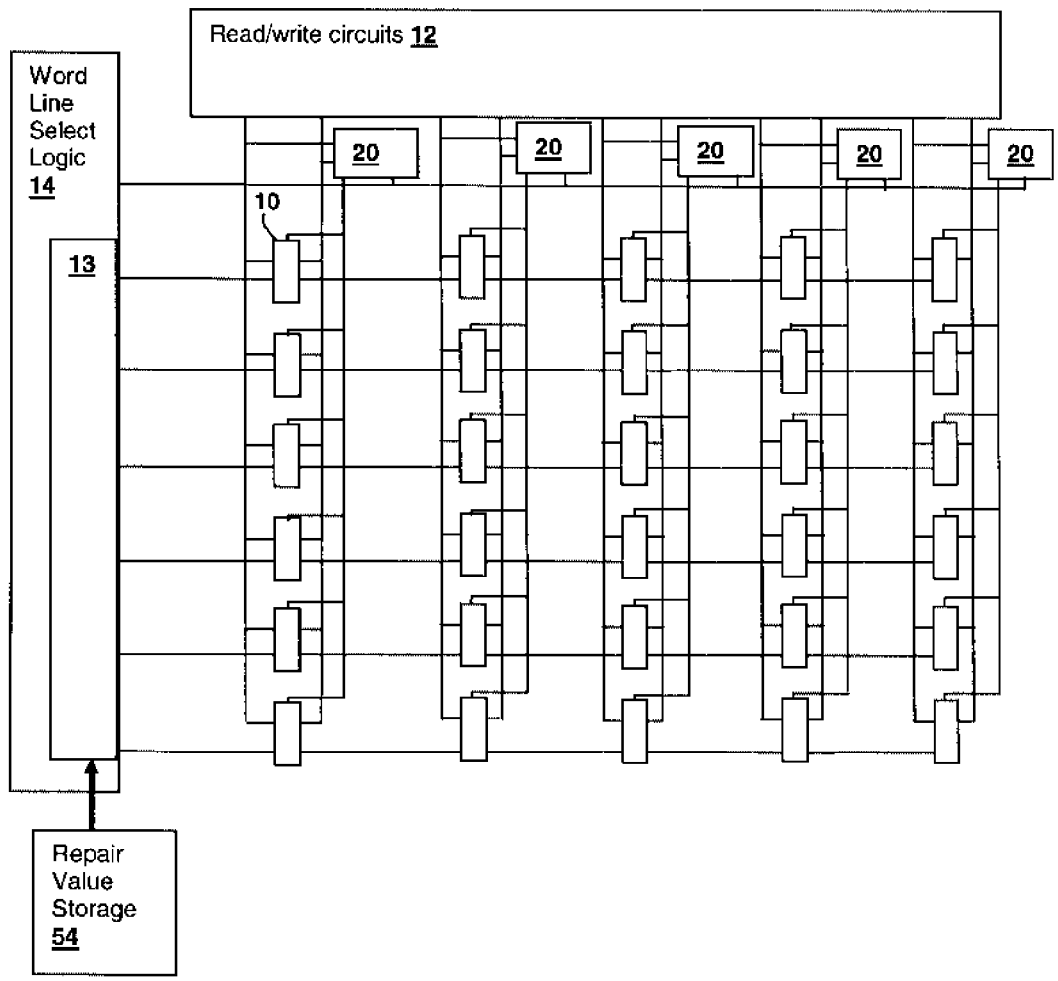
FIG. 5 is a block diagram of a storage array circuit in accordance with yet another embodiment of the invention.

Referring now to FIG. 5, a storage device in accordance with yet another embodiment of the present invention is shown in the form of an SRAM storage array circuit. The storage array circuit of FIG. 5 is similar to storage array circuit of FIG. 1 and therefore only differences between them will be described below. In the circuit of FIG. 5, redundancy wordline remapping logic 13 is provided in wordline select logic 14, so that additional redundant rows supplied within the storage array may be selected according to a repair value storage 54, which is generally a fuse array, but may also be a memory such as voltage control memory 32 of FIG. 4 and the storage for repair selection and voltage selection may be co-located. A repaired array will have at least one of rows de-selected to be replaced by another one of the rows. As mentioned above, the repair and voltage selection can be used in concert to achieve the highest possible yield. In general, the repair will be effected so that all of the columns can be operated at power supply voltage $V_{DDLO}$, unless that condition cannot be effected to meet performance margins, in which case the maximum number of columns that can be operated at power supply voltage $V_{DDLO}$ while meeting performance margins will be selected by the digital voltage selection control values.

Figure 6A:
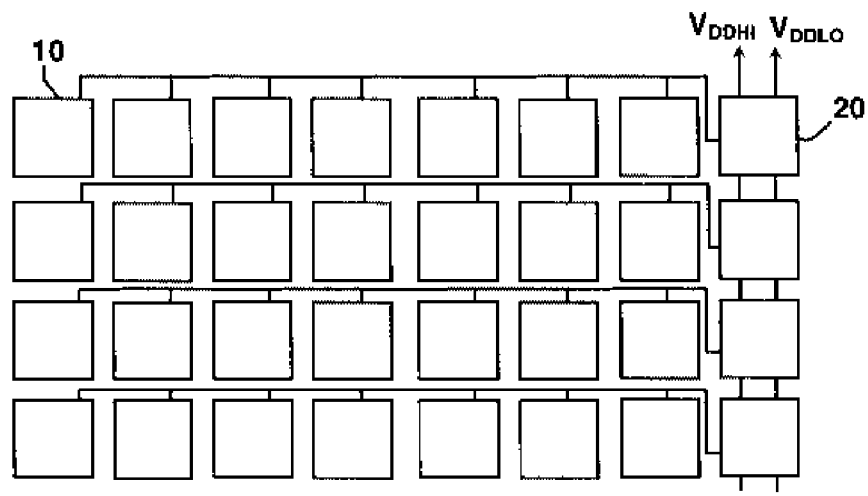
FIG. 6A and FIG. 6B are block diagrams of storage array circuits in accordance with other embodiments of the invention having power supply voltage selection for elements other than columns.
Figure 6B:
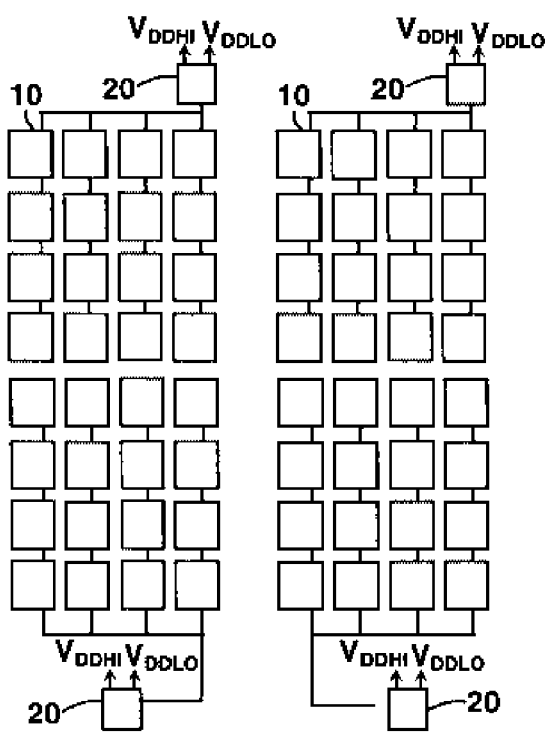

Referring now to FIG. 6A and FIG. 6B, storage array circuits having voltage selection for elements other than columns are shown. FIG. 6A illustrates an array of storage cells 10 including voltage selection circuits 20 that select a power supply voltage for each row. FIG. 6B illustrates an array of storage cells 10 arranged in four sub-arrays. Voltage selection circuits 20 select a power supply voltage for each sub-array.

Figure 7:
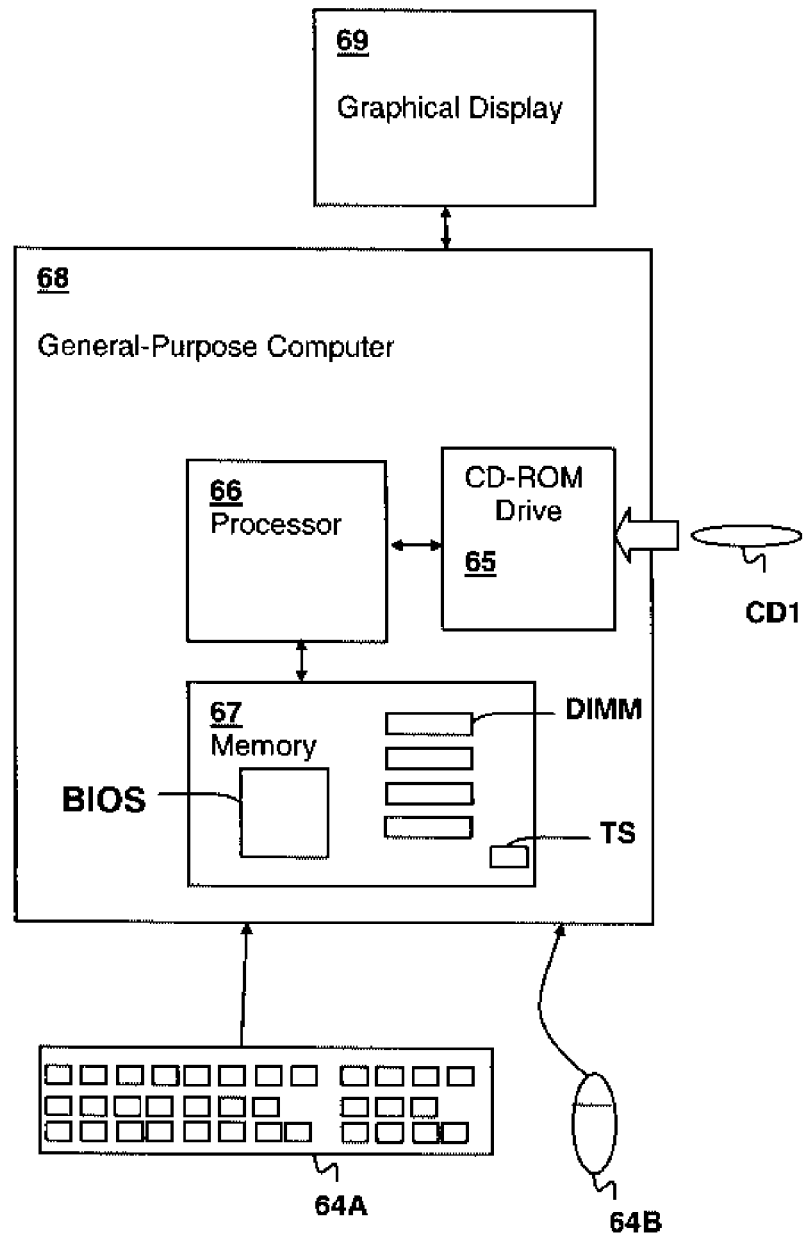
FIG. 7 is a pictorial block diagram illustrating a general-purpose computer system according to an embodiment of the present invention.

Referring now to FIG. 7, a general-purpose computer system in accordance with an embodiment of the present invention is shown. A general-purpose computer 68 is coupled to a graphical display 69 for displaying program output, such as an interface to an operating system including features in accordance with an embodiment of the present invention that set the digital control values of each storage device included in one or more memory modules DIMM within memory 67. General-purpose computer 68 is also coupled to input devices such as a keyboard 64A and a pointing device 64B. A processor 66 within general-purpose computer 68 executes program instructions stored in memory 67, including program instructions include in a built-in operating system non-volatile storage BIOS. Program instructions within memory 67 retrieve a set of digital control values for each of the storage devices within memory modules DIMM, and transfer the control values via one of the interface types mentioned above or another interface, to memory modules DIMM, so that the proper operating voltages are set within each element of the devices making up memory modules DIMM. To ensure proper initialization, the default voltage of voltage selection circuits can be arranged to be $V_{DDHI}$, the system can be operated from program instructions in non-volatile storage such as built-in operating system non-volatile storage BIOS, or the system can be initialized at lower frequency operating point or all selectable voltages can be initially set to $V_{DDHI}$. The digital control values, as well as the program/operating system driver can be supplied with memory modules DIMM on media such as compact disc CD1, and read via a CD-ROM drive 65. Compact disc CD1 can also form computer readable media for storing the program instructions embodying methods according to embodiments of the present invention, such as an operating system driver for loading the control values into DIMMS. A temperature sensor TS may be included within memory 67 to provide an indication of operating temperature, and the program instructions may change the digital selection values in response to a detected range or value of temperature. The digital selection values may be changed at detection of other system changes, such as change of processor frequency or system operating voltage, so that yields may further be improved and/or power consumption further reduced.

Figure 8:
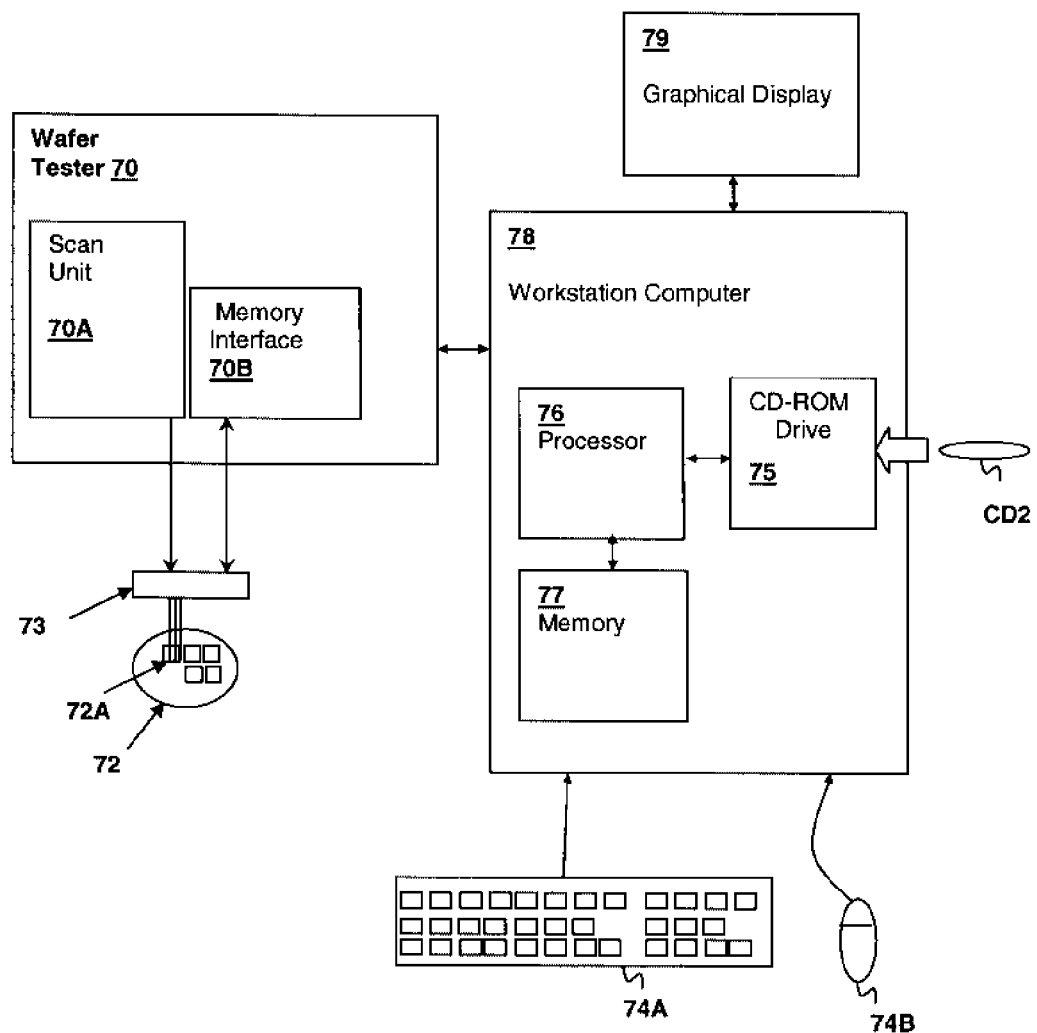
FIG. 8 is a wafer test system which may be used to determine digital control values as used in embodiments of the present invention.

Referring now to FIG. 8, a VLSI wafer test system for obtaining the digital control values is depicted. The above-incorporated U.S. patent application "METHOD AND SYSTEM FOR DETERMINING ELEMENT VOLTAGE SELECTION CONTROL VALUES FOR A STORAGE ARRAY" supplies complete disclosure of methods, systems and computer programs for determining the digital control values. However, for the purpose of illustration within this application, the system of FIG. 8 provides a mechanism that can obtain a set of digital control values for use in the storage devices described above. A wafer tester 70 includes a boundary scan unit 70A for providing stimulus to and retrieving data from a die 72A on a wafer under test 72 via a probe head 73 having electrical test connections to die 72A. Wafer tester 70 includes a memory interface 70B for exercising a storage device in accordance with an embodiment of the present invention that is integrated on die 72A.

A workstation computer 78, has a processor 76 coupled to a memory 77, for executing program instructions from memory 77, wherein the program instructions include program instructions for setting digital control values within the storage devices integrated on die 72A, receiving data from memory interface tester 70B and transferring control values to and from scan unit 70A. Workstation computer 78 is coupled to wafer tester 70 via an electrical interface. Generally, the test methodology employed to obtain the digital control values operates scan unit 70A to set the digital control values within storage devices integrated on die 72A and then operates memory interface 70B under controlled environmental characteristics such as temperature, to test the storage device, including varying the frequency of operation and/or other timing characteristics provided by memory interface 70B to detect failures within the storage devices on die 72A. The failures can be detected by operating the storage devices on die 72A at the lowest selectable power supply voltage, e.g. $V_{DDLO}$ and then raising the voltage for failed elements if any failure occurs. Repairs via redundant element or element-orthogonal cell group selection such as redundant row selection can alternatively be performed prior to raising the voltage, in order to attempt to repair the storage devices and then increasing the selected voltage for failed elements that could not be eliminated via the repair selection. Once any repairs and raised voltages are known, a set of digital control values associated with the storage devices integrated on die 72A can be recorded for future use with the final device that includes die 72A, e.g. by providing media such as compact disc CD2 written by CD-ROM drive 75 and encoding values for initializing the device with the digital voltage selection control values and optionally a set of repair values, if the repair is not effected by a fuse or mask. As an alternative to associating media with die 72A if the digital selection values are provided by a fuse or mask on die 72A, the values can be programmed or used to inform a subsequent mask-metallization/metal removal process. As another alternative to media such as compact disc CD2, a non-volatile storage device can be programmed with the digital control values and read by a processor, or a circuit integrated on die 72A, to initialize the storage devices with the digital voltage selection control values.

While the invention has been particularly shown and described with reference to the preferred embodiment thereof, it will be understood by those skilled in the art that the foregoing and other changes in form, and details may be made therein without departing from the spirit and scope of the invention.

What is claimed is:

1. A storage circuit, comprising:
a plurality of storage elements comprising groups of storage cells;
control logic for providing read and write access between the storage cells and a storage interface;
a plurality of voltage selection circuits, each having an output coupled to a power supply input of a corresponding one of the plurality of storage array elements and at least two power supply inputs, each coupled to a plurality of power supply voltage sources having differing non-zero voltages, wherein the voltage selection circuits each provide a selected one of the plurality of differing non-zero voltages in response to a corresponding one of a plurality of digital control values; and
a control value storage coupled to each of the voltage selection circuits for supplying the digital control values to the voltage selection circuits, whereby a minimum performance level of a first set of the plurality of the storage elements having a lower performance is assured by selecting a higher one of the differing non-zero voltages for application to the first set, and whereby lower power consumption is provided by selecting a lower one of the differing non-zero power supply voltages for application to a second set of the plurality of storage elements that have a higher performance.

2. The storage circuit of claim 1, wherein the storage cells are arranged in an array of rows and columns, and wherein the storage elements are columns of the array, whereby the digital values select a particular one of the differing voltages to supply to each column of the array.

3. The storage circuit of claim 1, wherein the storage cells are arranged in an array of rows and columns, and wherein the storage elements are columns of the array, whereby the digital values select a particular one of the differing voltages to supply to each row of the array.

4. The storage circuit of claim 1, wherein the storage cells are arranged in multiple sub-arrays, wherein the storage elements are columns of the array, whereby the digital values select a particular one of the differing voltages to supply to each sub-array.

5. The storage circuit of claim 1, wherein the control value storage comprises a storage cell located in each of the storage elements and is accessed by the control logic.

6. The storage circuit of claim 1, wherein the control value storage comprises a storage separate from the storage elements and wherein the storage circuit further comprises a second control logic for accessing the control value storage.

7. The storage circuit of claim 1, wherein the voltage selection circuit includes an input for disabling selection of power supply voltage at the output of the plurality of voltage selection circuits, whereby the storage elements are placed in a power-down state when a signal provided to the input is in a predetermined logic state.

8. The storage circuit of claim 1, wherein the control logic includes redundancy control logic, wherein the storage circuit further includes storage for redundancy control values that select particular cell groups as replacements for groups of cells within each element or selecting replacement of entire elements.

9. A system, comprising:
a processor for executing program instructions; and
one or more storage devices comprising
a plurality of storage elements comprising groups of storage cells,
control logic for providing read and write access between the storage cells and a storage interface,
a plurality of voltage selection circuits, each having an output coupled to a power supply input of a corresponding one of the plurality of storage array elements and at least two power supply inputs, each coupled to a plurality of power supply voltage sources having differing non-zero voltages, wherein the voltage selection circuits each provide a selected one of the plurality of differing non-zero voltages in response to a corresponding one of a plurality of digital control values, and
a control value storage coupled to each of the voltage selection circuits for supplying the digital control values to the voltage selection circuits, whereby a minimum performance level of a first set of the plurality of the storage elements having a lower performance is assured by selecting a higher one of the differing non-zero voltages for application to the first set, and whereby lower power consumption is provided by selecting a lower one of the differing non-zero power supply voltages for application to a second set of the plurality of storage elements that have a higher performance.

10. The system of claim 9, wherein the control value storage is a non-volatile storage within the one or more storage devices.

11. The system of claim 9, wherein the control value storage is a volatile storage within the one or more storage devices, and wherein the system further comprises a memory coupled to the processor for storing program instructions for execution by the processor, wherein the program instructions comprise program instructions for setting the digital control values in the control value storage of each of the one or more storage devices according to a predetermined set of values for each of the one or more storage devices.

12. The system of claim 11, wherein the program instructions further comprise program instructions for reading the digital control values from a media supplied in association with the one or more storage devices.

13. The system of claim 11, wherein the program instructions further comprise program instructions for:
   testing the one or more storage devices with a memory exerciser; and
   determining a new set for the digital control values from a result of the testing, and wherein the program instructions for setting are executed to store the new set of digital control values in the control value storage of the one or more storage devices.

14. The system of claim 11, further comprising program instructions for:
   sensing changes in an environmental state of the system such that performance characteristics of the one or more storage devices is expected to change;
   determining a new set for the digital control values from a result of the sensing, and wherein the program instructions for setting are executed to store the new set of digital control values in the control value storage of the one or more storage devices.

* * * * *